US010211333B2

(12) United States Patent
Bobde et al.

(10) Patent No.: US 10,211,333 B2
(45) Date of Patent: Feb. 19, 2019

(54) SCALABLE SGT STRUCTURE WITH IMPROVED FOM

(71) Applicant: Alpha and Omega Semiconductor (Cayman) Ltd., Grand Cayman (KY)

(72) Inventors: Madhur Bobde, Sunnyvale, CA (US); Sik Lui, Sunnyvale, CA (US)

(73) Assignee: ALPHA AND OMEGA SEMICONDUCTOR (CAYMAN) LTD., Grand Cayman (KY)

(*) Notice: Subject to any disclaimer, the term of this patent is extended or adjusted under 35 U.S.C. 154(b) by 0 days.

(21) Appl. No.: 15/498,366

(22) Filed: Apr. 26, 2017

(65) Prior Publication Data

US 2018/0315846 A1    Nov. 1, 2018

(51) Int. Cl.
| H01L 29/78 | (2006.01) |
| H01L 29/423 | (2006.01) |
| H01L 29/788 | (2006.01) |
| H01L 29/40 | (2006.01) |
| H01L 21/28 | (2006.01) |
| H01L 29/66 | (2006.01) |

(52) U.S. Cl.
CPC .... *H01L 29/7813* (2013.01); *H01L 21/28273* (2013.01); *H01L 29/407* (2013.01); *H01L 29/4236* (2013.01); *H01L 29/42324* (2013.01); *H01L 29/42376* (2013.01); *H01L 29/66734* (2013.01); *H01L 29/66825* (2013.01); *H01L 29/7889* (2013.01)

(58) Field of Classification Search
CPC ............... H01L 29/7813; H01L 29/407; H01L 21/28273

USPC ......................................................... 257/330
See application file for complete search history.

(56) References Cited

U.S. PATENT DOCUMENTS

| 5,998,833 | A | 12/1999 | Baliga |
| 6,479,352 | B2* | 11/2002 | Blanchard ............... H01L 22/26 257/E21.149 |
| 6,927,458 | B2 | 8/2005 | Worley |
| 7,345,342 | B2* | 3/2008 | Challa ................. H01L 21/3065 257/331 |
| 7,816,720 | B1 | 10/2010 | Hsieh |
| 8,138,605 | B2 | 3/2012 | Chang et al. |
| 8,324,683 | B2 | 12/2012 | Lui et al. |
| 8,394,702 | B2 | 3/2013 | Tai et al. |
| 8,502,302 | B2 | 8/2013 | Su et al. |

(Continued)

FOREIGN PATENT DOCUMENTS

WO    WO 2015/114803    *    8/2015    ......... H01L 29/7813

*Primary Examiner* — Mark Prenty
(74) *Attorney, Agent, or Firm* — JDI Patent; Joshua D. Isenberg; Robert Pullman

(57) ABSTRACT

A shielded gate trench field effect transistor comprises an epitaxial layer above a substrate, a body region, a trench formed in the body region and epitaxial layer and one or more source regions formed in a top surface of the body region and adjacent a sidewall of the trench. A shield electrode is formed in a lower portion of the trench and a gate electrode is formed in an upper portion of the trench above the shield electrode. The shield electrode is insulated from the epitaxial layer by a first dielectric layer. The gate electrode is insulated from the epitaxial layer by the first dielectric layer and insulated from the shield electrode by a second dielectric layer. The first and second dielectric layer has a same thickness.

18 Claims, 18 Drawing Sheets

(56) References Cited

U.S. PATENT DOCUMENTS

| | | |
|---|---|---|
| 8,507,978 B2 | 8/2013 | Bhalla et al. |
| 8,580,676 B2 | 11/2013 | Chang et al. |
| 8,703,563 B2 | 4/2014 | Hébert et al. |
| 8,785,270 B2 | 7/2014 | Su et al. |
| 8,809,948 B1 | 8/2014 | Yilmaz et al. |
| 8,828,857 B2 | 9/2014 | Lui et al. |
| 8,907,416 B2 | 12/2014 | Tai et al. |
| 8,933,506 B2 | 1/2015 | Bobde et al. |
| 8,946,816 B2 | 2/2015 | Bobde et al. |
| 8,951,867 B2 | 2/2015 | Lee et al. |
| 8,980,716 B2 | 3/2015 | Lui et al. |
| 9,082,790 B2 | 7/2015 | Bobde et al. |
| 9,105,494 B2 | 8/2015 | Lee et al. |
| 9,136,380 B2 | 9/2015 | Yilmaz et al. |
| 9,190,512 B2 | 11/2015 | Lee et al. |
| 9,214,545 B2 | 12/2015 | Tai et al. |
| 9,230,957 B2 | 1/2016 | Lui et al. |
| 9,252,264 B2 | 2/2016 | Bobde et al. |
| 9,391,061 B2 | 7/2016 | Guan et al. |
| 9,412,733 B2 | 8/2016 | Calafut et al. |
| 9,450,088 B2 | 9/2016 | Lee et al. |
| 9,484,452 B2 | 11/2016 | Bobde et al. |
| 9,484,453 B2 | 11/2016 | Yilmaz et al. |
| 9,502,554 B2 | 11/2016 | Bobde et al. |
| 9,530,885 B2 | 12/2016 | Bobde et al. |
| 9,685,435 B2 | 6/2017 | Lui et al. |
| 9,685,523 B2 | 6/2017 | Bobde et al. |
| 9,711,637 B2 * | 7/2017 | Numabe ............. H01L 29/7813 |
| 2011/0233667 A1 | 9/2011 | Tai et al. |
| 2012/0025874 A1 * | 2/2012 | Saikaku ............. H01L 29/1095 |
| | | 327/109 |
| 2012/0132988 A1 | 5/2012 | Lui et al. |
| 2012/0193676 A1 | 8/2012 | Bobde et al. |
| 2014/0048846 A1 | 2/2014 | Lui et al. |
| 2014/0231963 A1 | 8/2014 | Guan et al. |
| 2015/0021682 A1 | 1/2015 | Bobde et al. |
| 2015/0097232 A1 | 4/2015 | Tai et al. |
| 2015/0137227 A1 | 5/2015 | Bobde et al. |
| 2015/0171201 A1 | 6/2015 | Lui et al. |
| 2015/0279989 A1 | 10/2015 | Bobde et al. |
| 2016/0141411 A1 | 5/2016 | Bobde et al. |
| 2016/0300833 A1 | 10/2016 | Guan et al. |

* cited by examiner

400

SCALABLE SGT STRUCTURE WITH IMPROVED FOM

FIELD OF THE DISCLOSURE

This invention relates in general to semiconductor switching devices, and more specifically to a shielded gate trench field effect transistor for high power applications and a method for fabricating the same.

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like.

Shielded gate trench MOSFETs are preferred for certain applications over conventional MOSFETs and conventional trench MOSFETs because they provide several advantageous characteristics. Shielded gate trench MOSFETs exhibit reduced gate-to-drain capacitance $C_{gd}$, reduced on-resistance $R_{DSon}$, and increased breakdown voltage of the transistor. For conventional trench MOSFETs, the placement of trench gate to form vertical channel, while decreasing the on-resistance, also increases the overall gate-to-drain capacitance. The introduction of the shielded gate trench MOSFET structure remedies this issue by shielding the gate from the electric field in the drift region, thereby substantially reducing the gate-to-drain capacitance. The shielded gate trench MOSFET structure also provides the added benefit of higher minority carrier concentration in the drift region for the device's breakdown voltage and hence lower on-resistance. The improved performance characteristics of the shielded gate trench MOSFET make the technology an excellent choice for power switching applications such as the switching mode power supply (SMPS) commonly referred to as a synchronous buck converter (DC-DC converter).

The $R_{DSon} \times Q_G$, Figure of Merit (FOM) is generally considered one of the important indicators of MOSFET performance in SNIPS, where $R_{DSON}$ is the specific on-state resistance and $Q_G$ is the gate charge. It generally requires a high blocking voltage (BV) and low on-state resistance ($R_{DSon}$). In addition, the recent computing applications require the power MOSFET operate in high switching frequency. Thus, it is desirable to develop semiconductor power switching devices that can be switched at high speed and have high maximum blocking voltage capability and low on-state resistance.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. For convenience, use of + or − after a designation of conductivity or charge carrier type (p or n) refers generally to a relative degree of concentration of designated type of charge carriers within a semiconductor material. In general terms an n+ material has a higher negative charge carrier (e.g., electron) concentration than an n material and an n material has a higher carrier concentration than an n− material. Similarly, a p+ material has a higher positive charge carrier (e.g., hole) concentration than a p material and a p material has a higher concentration than a p− material. It is noted that what is relevant is the concentration of charge carriers, not necessarily dopants. For example, a material may be heavily doped with n-type dopants but still have a relatively low charge carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

INTRODUCTION

Some designs have been proposed to employ UMOSFETs as power semiconductor devices to improve the maximum blocking voltage and reduce on-state resistance. With respect to high frequency switching characteristics, U.S. Pat. No. 5,998,833 to Baliga, the disclosure of which is hereby incorporated herein as reference, discloses a UMOSFET structure to improve the high-frequency figure-of-merit (HFOM). HFOM is defined as $(R_{DSon}(Q_{GS}+Q_{GD}))^{-1}$, where $Q_{GS}$ and $Q_{GD}$ represent the gate-source and gate-drain charge per unit area.

Figure 1:
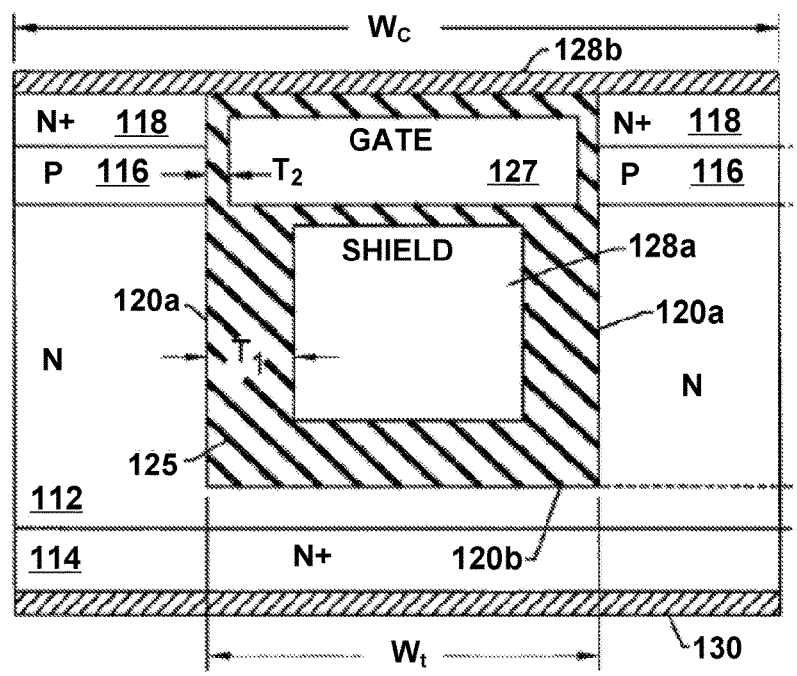
FIG. 1 is a cross-sectional view of a conventional power semiconductor device.
Figure 3:
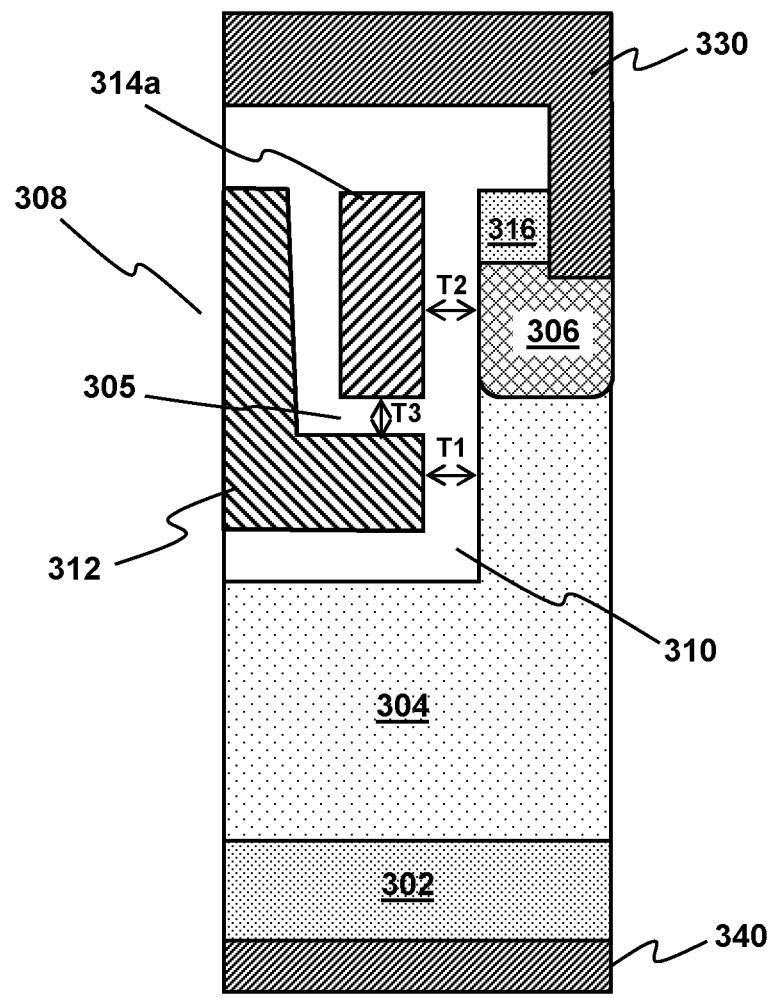
FIG. 3 is a cross-sectional view of another power semiconductor device according to aspects of the present disclosure.

FIG. 1, which is a reproduction of FIG. 3 from the aforementioned '833 patent, shows a cross-sectional view of a graded-doped (GD) UMOSFET unit cell of a power semiconductor device. The UMOSFET unit cell 100 of FIG. 1 comprises a highly doped drain layer 114 of first conductivity type (e.g., N+), a drift layer 112 of first conductivity type having a linearly graded doping concentration, a relatively thin base layer 116 of second conductivity type opposite to the first conductivity type (e.g., P), and a highly doped source layer 118 of first conductivity type (e.g., N+). The drift layer 112 may have a linearly graded doping concentration therein, e.g., with a maximum concentration of greater than about $5 \times 10^{16}$ cm$^{-3}$ at the interface between the drift layer 112 and the drain layer 114 and a minimum concentration of about $1 \times 10^{16}$ cm$^{-3}$ at a depth of 1 μm and continuing at a uniform level to the top surface of the semiconductor power device 100. A source electrode 128b and drain electrode 130 are provided at the top and bottom surface of the semiconductor power device 100.

A stripe-shaped trench comprises an upper gate electrode 127, a lower trench-based source (or shield) electrode 128a and an insulating region 125. The thickness of the insulating region 125 between the trench sidewall 120a to the shield electrode 128a (T1) is thicker than the thickness between the trench sidewall 120a to the gate electrode 127 (T2). The '833 patent points out that the use of the lower shield electrode 128a separated from the upper gate electrode 127 instead of a larger gate electrode which occupies the entire trench as in the conventional UMOSFET structure, reduces the gate-to-drain capacitance ($C_{GD}$) of the UMOSFET and thereby improves switching speed by reducing the amount of gate charging and discharging current that is needed during high frequency operation.

While the GD-UMOSFET unit cell 100 of FIG. 1 may have an improved HFOM comparing to the HFOM for the conventional UMOSFET structure, such structure would encounter several challenges when the pitch of a unit cell is less than 1 µm or down to 0.6 µm. First, it becomes difficult to scale trench width due to the thick liner oxide requirement for the charge balance. In addition, since the pitch is small, the mesa is extremely narrow and thus it is hard to have a stable process. Moreover, due to the small pitch, the gate-to-drain capacitance ($C_{GD}$), $Q_S$ (the source charge per unit area) and $Q_G$ (the gate charge per unit area) are extremely high, affecting the HFOM.

Aspects of the present disclosure disclose a power semiconductor device with improved high frequency switching characteristics even when the cell pitch of the power semiconductor device is less than 1 µm or down to 0.6 µm). The power semiconductor device according to aspects of the present disclosure comprises a shielded gate trench MOSFET having a shallow trench with a thin oxide liner as well as a thin inter-poly oxide between the gate and shield electrode.

EMBODIMENTS

Figure 2:
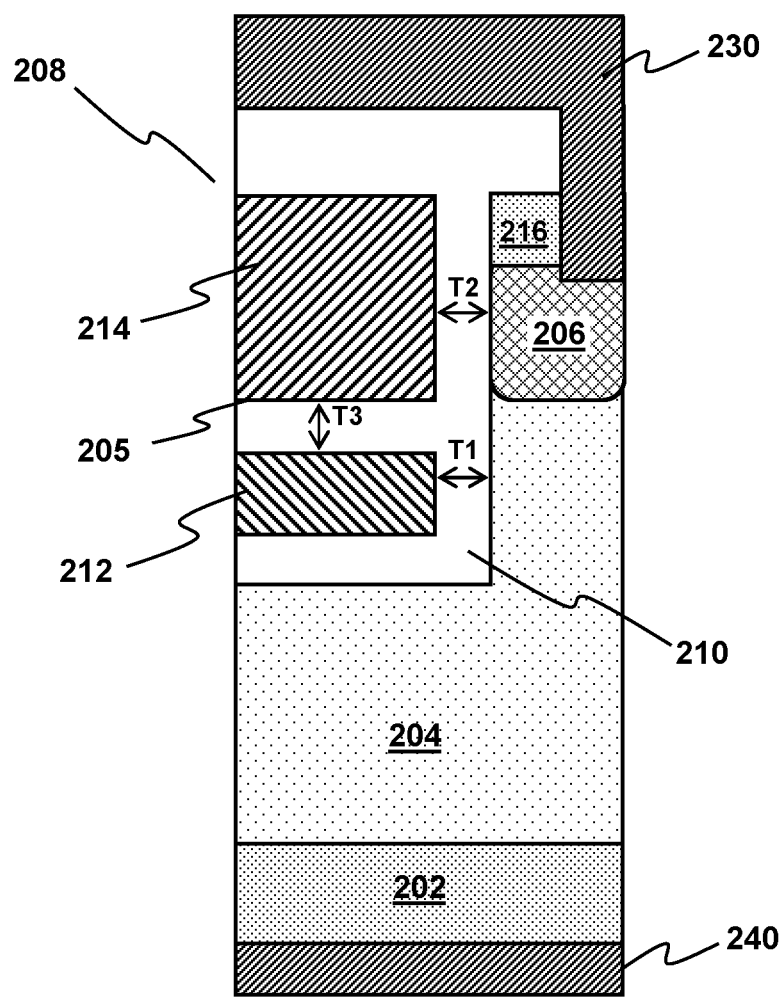
FIG. 2 is a cross-sectional view of a power semiconductor device according to aspects of the present disclosure.

FIG. 2 illustrates a cross-sectional schematic diagram of a half shield gate trench MOSFET according to aspects of the present disclosure. As with all the other figures described herein, the relative dimensions and sizes of the elements shown do not reflect actual dimensions and are for illustrative purposes only.

The shield gate trench MOSFET 200 starts with a substrate 202 of a first conductivity type. The substrate may be heavily doped with suitable dopant species. By way of example and not by way of limitation, the substrate may be an n+ substrate such as silicon. The substrate 202 acts as the drain of the shielded gate trench MOSFET device 200.

An epitaxial/drift layer 204 of a first conductivity type is formed above the substrate 202. By way of example, and not by way of limitation, the epitaxial/drift layer 204 may be n-type. The epitaxial layer 204 and substrate 202 may be doped with any suitable n-type dopant species (ions or atoms), such as phosphorous. The doping concentration of the epitaxial/drift layer 204 is fairly constant throughout its depth. By way of example, and not by way of limitation, the doping concentration of the epitaxial/drift layer 204 may be in a range from about $5e15$ cm$^{-3}$ to $1e17$ cm$^{-3}$. A body region 206 of a second conductivity type is formed above the epitaxial/drift layer 204. The second conductivity type is opposite to the first conductivity type. In one embodiment, the first conductivity type is n-type and the second conductivity type is p-type. The body region 206 may be doped with any suitable p-type dopant species, such as boron.

A trench 208 is formed in the body region 206 and the epitaxial/drift layer 204. The trench 208 is extended in depth about 0.5 microns or less. In one embodiment, the trench pitch is less than 1 µm. By way of example, and not by way of limitation, the trench pitch is about 0.6 µm. The trench is lined with a dielectric material 210 such as silicon oxide. A shield electrode 212 is formed in a lower portion of the trench 208. By way of example, and not by way of limitation, the shield electrode 212 may be composed of polysilicon or any other conductive material. The shield electrode 212 is insulated from the epitaxial/drift layer 204 by the dielectric material 210 lining the trench 208. As shown in FIG. 2, the dielectric material 210 has a thickness T1 between the shield electrode 212 and the sidewall of the trench. A gate electrode 214 is formed in the trench 208 above the shield electrode 212. The shield electrode 212 and gate electrode 214 can be made from the same type of material or from different materials. The gate electrode 214 is insulated from the epitaxial/drift layer 204 by the dielectric material 210 lining the trench 208. In addition, the gate electrode 214 is insulated from the shield electrode 212 by an inter-poly dielectric layer 205, such as silicon oxide. As shown in FIG. 2, the dielectric material 210 has a thickness T2 between the gate electrode 214 and the sidewall of the trench. In addition, the inter-poly dielectric layer has a thickness indicated as T3. In the embodiment of FIG. 2, the shield electrode 212 is as wide as the gate electrode 214 so that the shield electrode is completely overlapped with the gate electrode. As a result, the gate to drain coupling can be reduced. The liner oxide (i.e., the dielectric material 210) has a constant thickness, and the thickness T1 is the same as the thickness T2. In addition, the thickness of the inter poly dielectric layer 205 is also about the same as T1 and T2. In one embodiment, the thickness of the liner oxide 210 (T1 and T2) or the inter-poly dielectric layer 205 (T3) is in a range between 10 and 25 nm.

One source region 216 is formed in the body region 206 adjacent the sidewall of the trench 208. It is noted that while there is only one source region 216 shown in FIG. 2, there is at least one another adjacent the opposite trench sidewall which is not shown in the half shielded gate trench MOSFET 200. The source regions may be heavily doped with dopants of the same conductivity type as the substrate 202 and the epitaxial/drift layer 204. By way of example, and not by way of limitation, these source regions 216 may be doped with n+ type for an n+ type substrate 202. The MOSFET device 200 behaves as follows: when a positive voltage is applied to the gate electrode 214, the MOSFET device 200 turns on and a conducting channel is formed vertically within the body region 206 between the source region 216 and the drift/epitaxial region 204 along the walls of the trench 208.

A metal pad 230 is deposited above the body region 206 serving as the source pad and provides an external connection to the source region 216 of the shielded gate trench MOSFET device 200. The source pad 230 is insulated from the gate electrode 214 and shield electrode 212. Another metal pad 240 formed under the substrate 202 and serves as the drain electrode.

FIG. 3 illustrates a cross-sectional schematic diagram of another embodiment of a half shield gate trench MOSFET according to aspects of the present disclosure. Similar to the MOSFET 200 of FIG. 2, the MOSFET 300 comprises a substrate 302, an epitaxial/drift layer 304, a body region 306, one or more source regions 316, a source metal 330 and a drain electrode 340. For the components identical to that of MOSFET 200, the description thereof is omitted for simplification of the description.

The MOSFET 300 also comprises a trench 308 formed in the body region 306 and the epitaxial/drift layer 304. The trench 308 is extended in depth about 0.5 microns or less. In one embodiment, the trench pitch is less than 1 By way of example, and not by way of limitation, the trench pitch is about 0.6 The trench is lined with a dielectric material 310 such as silicon oxide. A T-shaped shield electrode 312 has a horizontal portion and a vertical portion formed in the trench 308 as shown in FIG. 3. By way of example, and not by way of limitation, the T-shaped shield electrode 312 may be composed of polysilicon or any other conductive material. The T-shaped shield electrode 312 is insulated from the epitaxial/drift layer 304 by the dielectric material 310 lining the trench 308. As shown in FIG. 3, the dielectric material 310 has a thickness T1 between the horizontal portion of the shield electrode 312 and the sidewall of the trench.

A split-gate electrode has two parts, each formed in the upper portion of the trench 308 above the horizontal portion of the shield electrode 312. One part of the split-gate electrode 314a is shown in FIG. 3. The split-gate electrode 314a is insulated from the epitaxial/drift layer 304 by the dielectric material 310 lining the trench 308. In addition, the split-gate electrode 314a is insulated from the shield electrode 312 by an inter-poly dielectric layer 305, such as silicon oxide. As shown in FIG. 3, the dielectric material 310 has a thickness T2 between the gate electrode 214 and the sidewall of the trench. In addition, the inter-poly dielectric layer has a thickness indicated as T3. In the embodiment of FIG. 3, the T-shaped shield electrode 312 is wider than the gate electrode 314 to achieve better de-coupling. As shown, the thickness T1 is the same as the thickness T2. In addition, the thickness of the inter poly dielectric layer 305 (T3) is also about the same as T1 and T2. In one embodiment, the thickness of the liner oxide 310 or the inter-poly dielectric layer 305 is in a range between 10 and 25 nm.

The GD-UMOSFET unit cell 100 of FIG. 1 discussed above uses thick oxide liner, thick inter-poly oxide, and graded dopant concentration in the epitaxial layer to help reduce $R_{DSon}$. Unlike the prior art, the shielded gate trench MOSFET according to aspects of the present disclosure has a thin oxide liner and inter-poly oxide, an ungraded, e.g., approximately constant, dopant concentration in the epitaxial layer and a relatively shallow depth of the trench 308 compared to the overall thickness of the epitaxial/drift layer 304. By way of example, and not by way of limitation, the doping concentration of the epitaxial/drift layer 304 between the interface with the substrate 302 and the body region 306 may vary locally by no more than about 5% from a nominal value and the depth of the trench 308 may be between 30% and 60% of the overall thickness of the drift epitaxial layer 304. These characteristics make the MOSFET 200 or 300 described above have no charge balance and help lower $Q_{GD}$ or $Q_{OSS}$ (i.e., the output charge of the MOSFET) significantly (i.e., about 40%) even at 0.6 μm pitch. As a result, the capacitance between gate and drain electrodes ($C_{GD}$) is reduced. While the high maximum blocking voltage capability has to be reduced from 20-30 V to 12-16V, such a blocking voltage is still sufficient for most applications. With the reduced blocking voltage, the on-state resistance $R_{DSon}$ may keep the same without increasing. It is noted that the MOSFET 200 of FIG. 2 or MOSFET 300 of FIG. 3 can optionally include a P-column in core cell or $3^{rd}$ dimension to maintain charge balance for devices that requires a blocking voltage of 25-30 V.

FIGS. 4A-4G illustrate a method for forming the shielded gate trench MOSFET device according to aspects of the present disclosure. While the diagrams and description will refer mainly to the shielded gate trench MOSFET device depicted in FIG. 2, one ordinarily skilled in the art will recognize that this fabrication method may be easily extended for any of the shielded gate trench MOSFET devices described above by including or omitting standard processing steps.

Figure 4A:
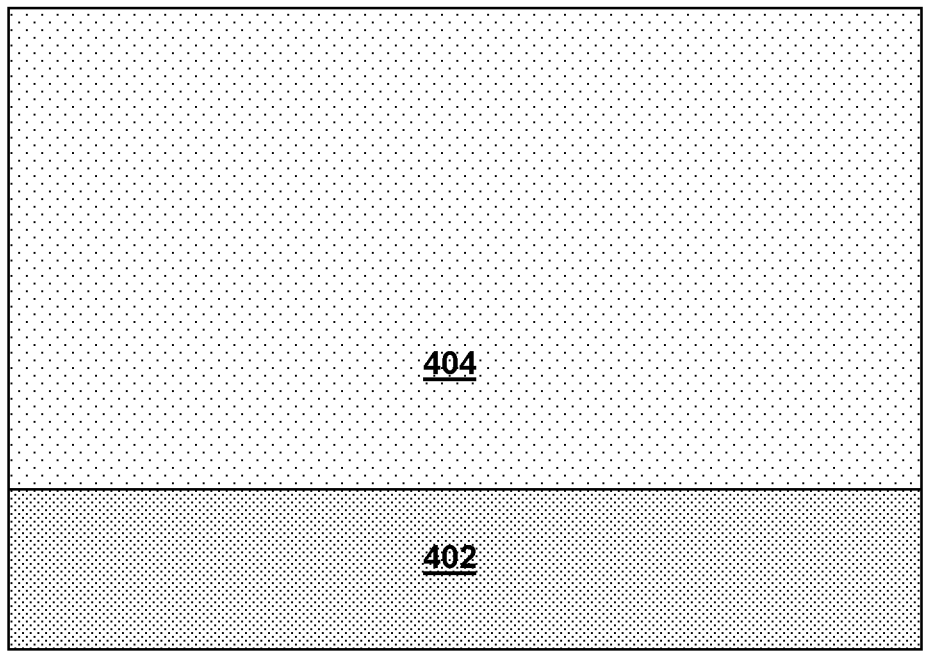
FIGS. 4A-4G are cross-sectional view schematic diagrams illustrating a method for fabricating a shielded gate trench MOSFET device according to aspects of the present disclosure.

Fabrication of a shielded gate trench MOSFET 400 begins with a substrate 402 of a first conductivity type which supports an epitaxial/drift layer 404 of the same conductivity type as the substrate 402 as illustrated in FIG. 4A. By way of example and not by way of limitation, the substrate 402 may be an n+ type substrate such as a silicon wafer. The substrate 402 forms the drain of the MOSFET device 400. The epitaxial/drift layer 404 may be grown over the substrate 402 and may be an n type epitaxial/drift layer 404. The doping concentration of the epitaxial/drift layer 404 is fairly constant throughout its depth. By way of example, and not by way of limitation, the doping concentration of the epitaxial/drift layer 404 may have a nominal value ranging from about 5e15 $cm^{-3}$ to about 1e17 $cm^{-3}$ and may vary locally from this nominal value by about 5 to 10%

Figure 4B:
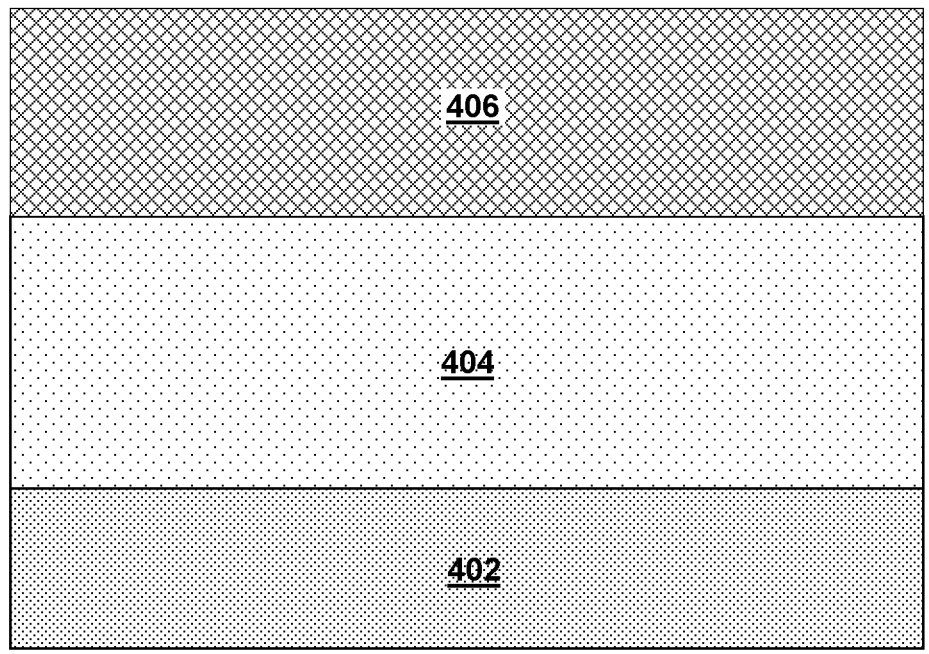

A body region 406 of a second conductivity type may then be formed by implantation of dopants into a top portion of the epitaxial/drift layer 404 as illustrated in FIG. 4B. By way of example, the body region 406 may be a p type body region 406. The body region 406 may be doped using ion implantation followed by diffusion to achieve the desired doping concentration. The body region 406 operates as a conducting channel between the source of the MOSFET device and the drain of the MOSFET device when the device is turned on.

Figure 4C:
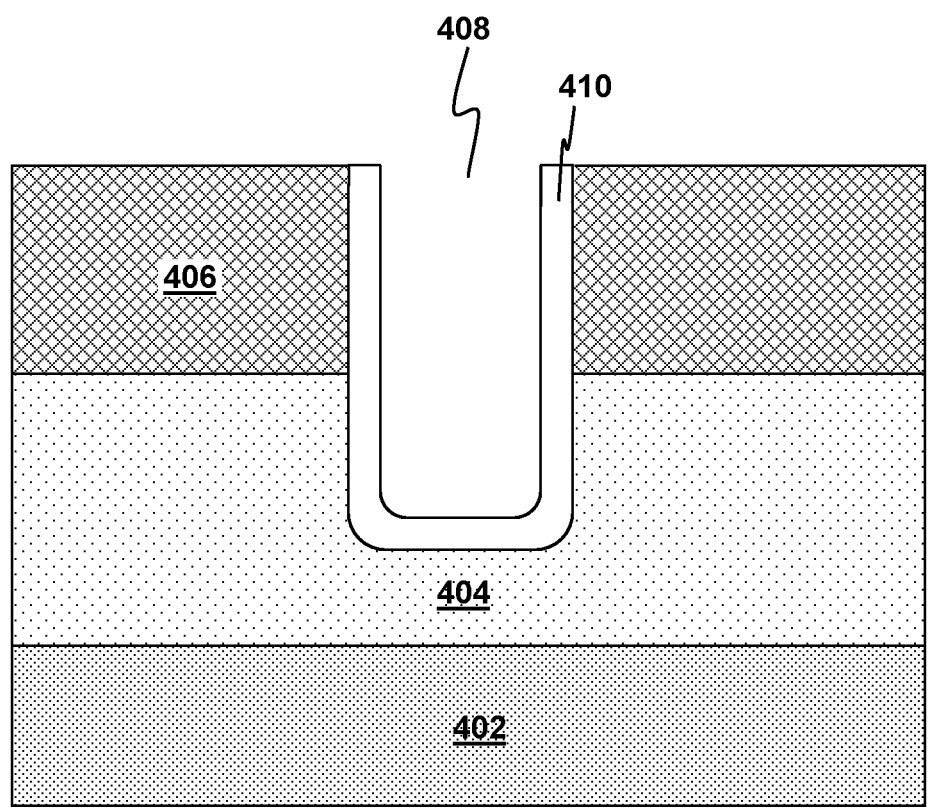

A trench 408 may then be formed within the body region 406 and epitaxial/drift layer 404 as illustrated in FIG. 4C. The trench 408 may be etched using a hard mask (mask not shown) to a depth such that the bottom of the trench 408 is located within the epitaxial/drift layer 404. In one embodiment, the trench 408 is etched to a depth of about 0.5 microns or less. The trench pitch is less than 1 By way of example, and not by way of limitation, the trench pitch is about 0.6 μm. A dielectric layer 410 may then be deposited or grown along the walls of the trench 408. In one embodiment, the thickness of the dielectric layer (i.e., liner oxide) 410 is in a range between 10 and 25 nm.

Figure 4D:
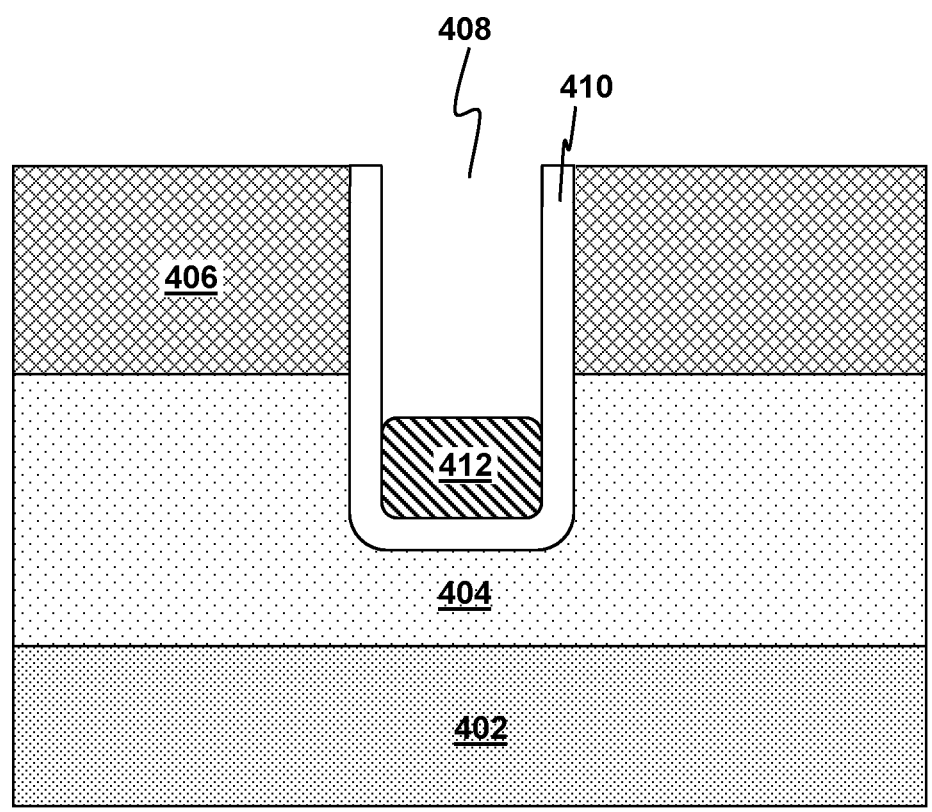

A shield electrode 412 may be formed within the trench 408 as illustrated in FIG. 4D. By way of example, and not by way of limitation, the shield electrode 412 may be composed of polysilicon or any other conducting material. While not illustrated, it is important to note that the shield electrode 412 may extend in a direction perpendicular to the plane of the cross-section in FIGS. 4A-4G, and may also extend vertically within the epitaxial/drift layer 404 and body layer 406 to facilitate the formation of external contacts.

Figure 4E:
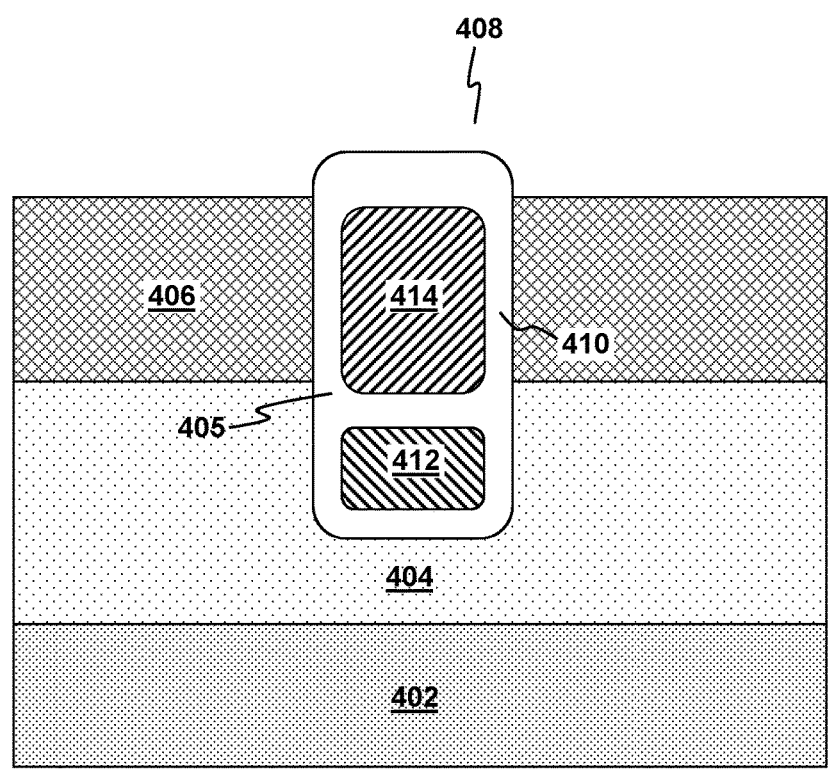

A gate electrode 414 may be formed within the trench 408 with a dielectric layer (i.e., inter-poly oxide) 405 insulating the gate electrode 414 from the shield electrode 412 as illustrated in FIG. 4E. The gate electrode 414 is also insulated from the epitaxial/drift layer 404 by the dielectric material 410 lining the trench 408. The thickness between the gate electrode 414 and the sidewall of the trench 408 is about the same as the thickness between the shield electrode 412 and the sidewall of the trench 408. The inter-poly oxide 405 has a thickness about the same as the thickness of the liner oxide 410. By way of example, and not by way of limitation, the inter-poly oxide has a thickness in a range between 10 to 25 Since the inter-poly oxide 405 is thin, it can be formed by a gate oxide growth process. The gate electrode 414 may be composed of polysilicon or any other conducting material. While not illustrated, it is important to note that the gate electrode 414 may extend in a direction perpendicular to the plane of the cross-section in FIGS. 4A-4G, and may also extend vertically within the epitaxial/drift layer 404 and body layer 406 to facilitate the formation of external contacts. Another dielectric layer may be formed above the gate electrode 414 in order to provide insulation.

In one embodiment, the shield electrode 412 may be a T-shaped shield electrode as the shield electrode 312 of FIG. 3 and the gate electrode 414 may be a split-gate electrode as the gate electrode 314 of FIG. 3. The T-shaped shield electrode 412 includes a horizontal portion and a vertical portion. In addition, the split-gate electrode 414 includes two parts, each formed in the upper portion of the trench 408. The split-gate electrode may be formed over the T-shaped shield electrode 412 by a conventional process. FIGS. 5A-5G show a method for fabricating a split-gate electrode in the gate trench for a MOSFET device according to aspects of the present disclosure.

Figure 5A:
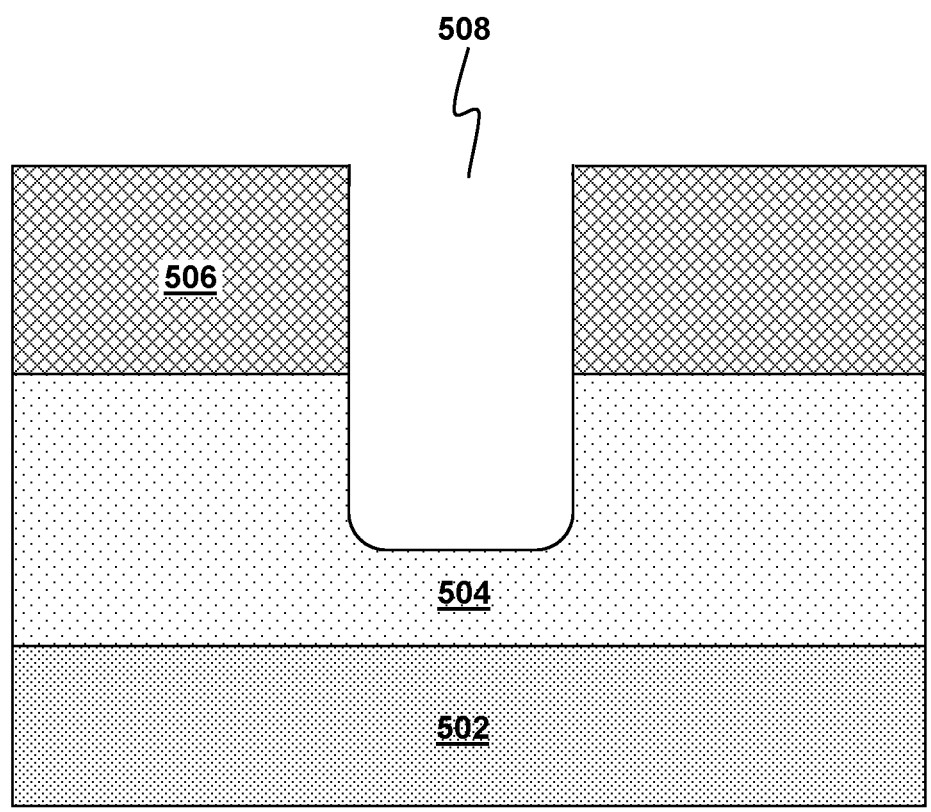
FIGS. 5A-5G are cross-sectional view schematic diagrams illustrating a method for fabricating a split-gate electrode in the gate trench for a MOSFET device according to aspects of the present disclosure.

In FIG. 5A, a trench 508 is formed within a body region 506 and epitaxial/drift layer 504 which is formed on top of a substrate 502. It is noted that the substrate 502, epitaxial/drift layer 504 and the body region 506 are formed similar to the process described in connection with FIGS. 4A-4C. The trench 508 may be etched using a hard mask (mask not shown) to a depth such that the bottom of the trench 508 is located within the epitaxial/drift layer 504. In one embodiment, the trench 508 is etched to a depth of about 0.5 microns or less. The trench pitch is less than 1 μm. By way of example, and not by way of limitation, the trench pitch is about 0.6 μm.

Figure 5B:
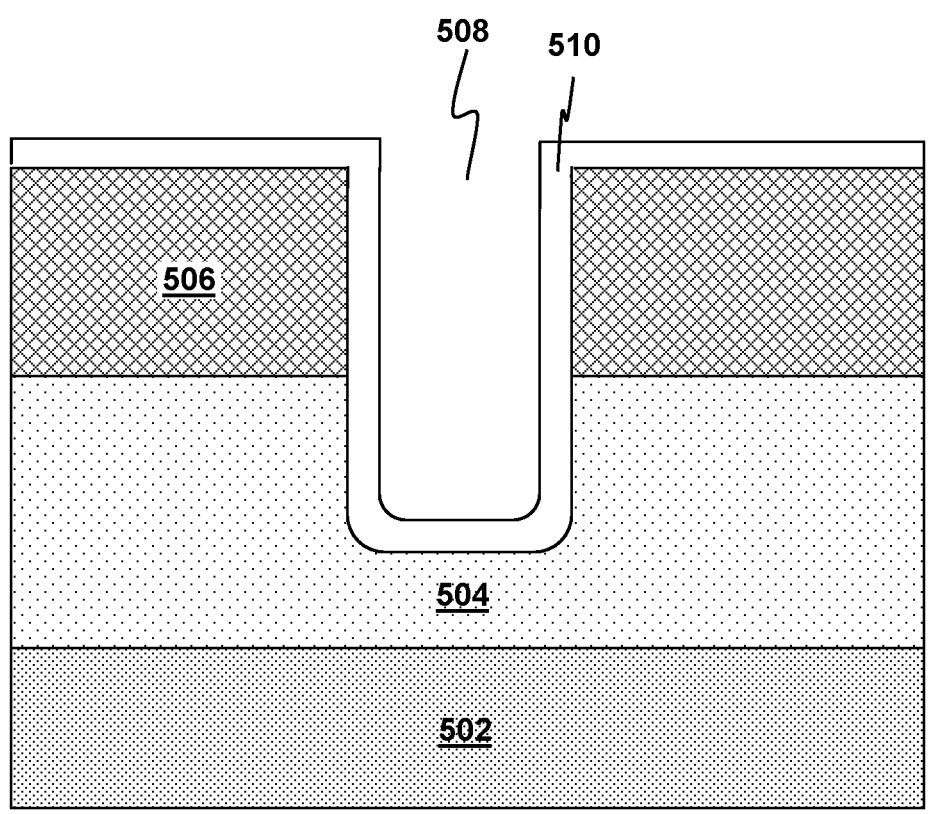
Figure 5C:
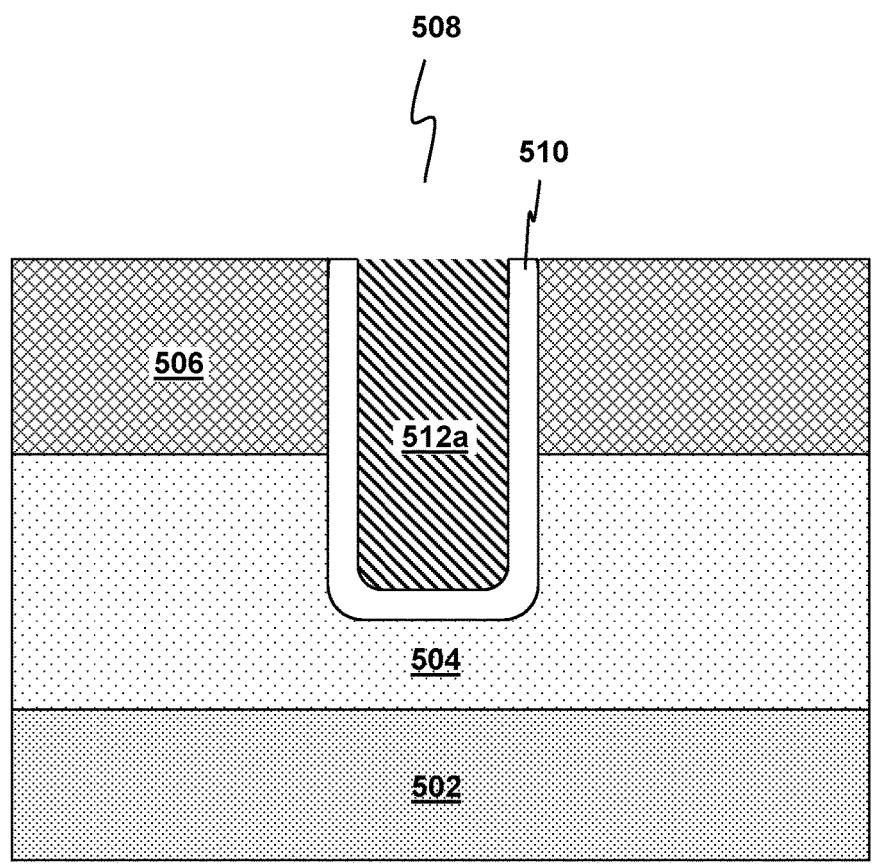
Figure 5D:
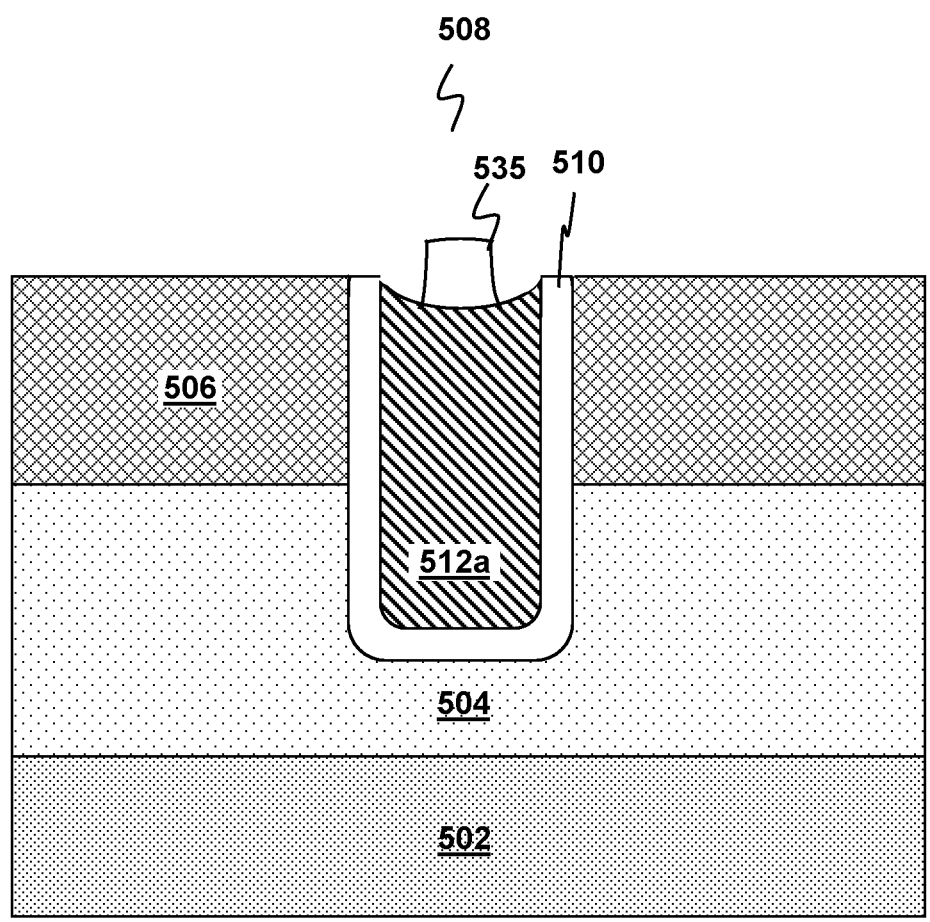
Figure 5E:
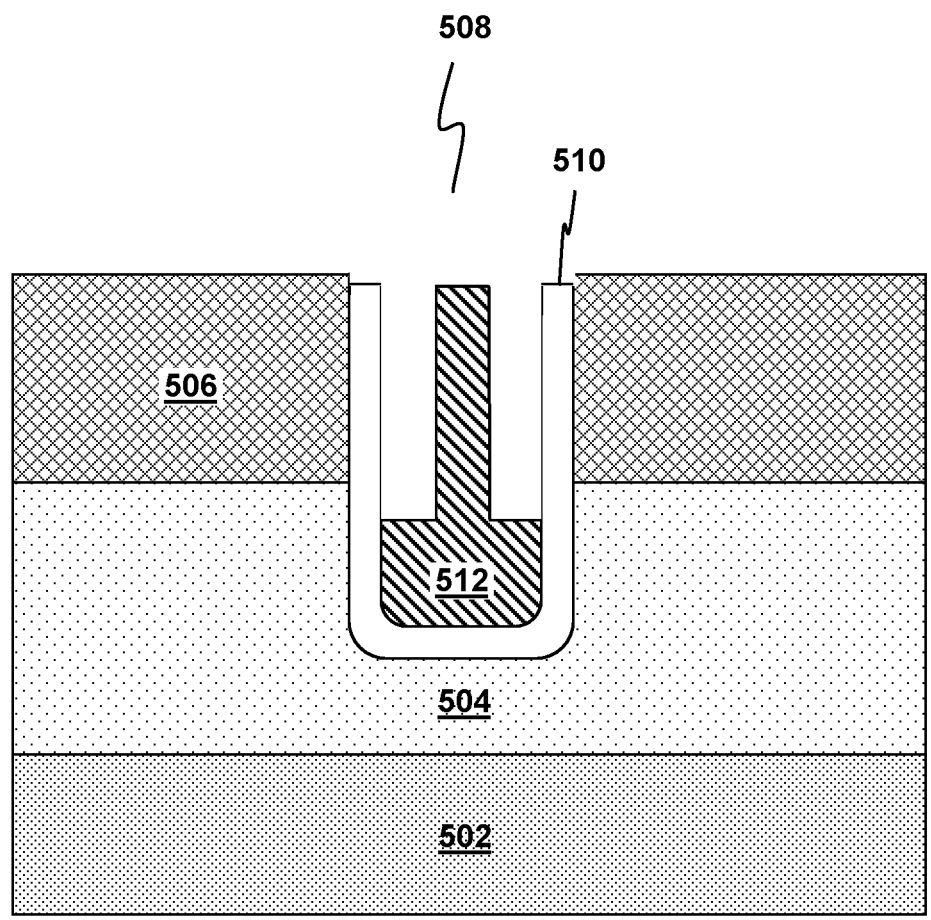

Next, a dielectric layer 510 may be deposited or grown along the walls of the trench 508 as shown in FIG. 5B. In one embodiment, the thickness of the dielectric layer (i.e., liner oxide) 510 is in a range between 10 and 25 nm. In FIG. 5C, the trench 508 is filled with a conductive material 512a (e.g., polysilicon) and the dielectric material 510 on top of the body is etched away. In FIG. 5D, The top of the conductive material 512a is oxidized forming a field oxide layer 535 and an isotropic etching is then performed. With the field oxide layer 535 acting as a mask, an anisotropic etching is performed to remove portions of the conductive material 512a uncovered by the field oxide layer 535 as shown in FIG. 5E. The T-shaped shield electrode 512 is thus formed.

Figure 5F:
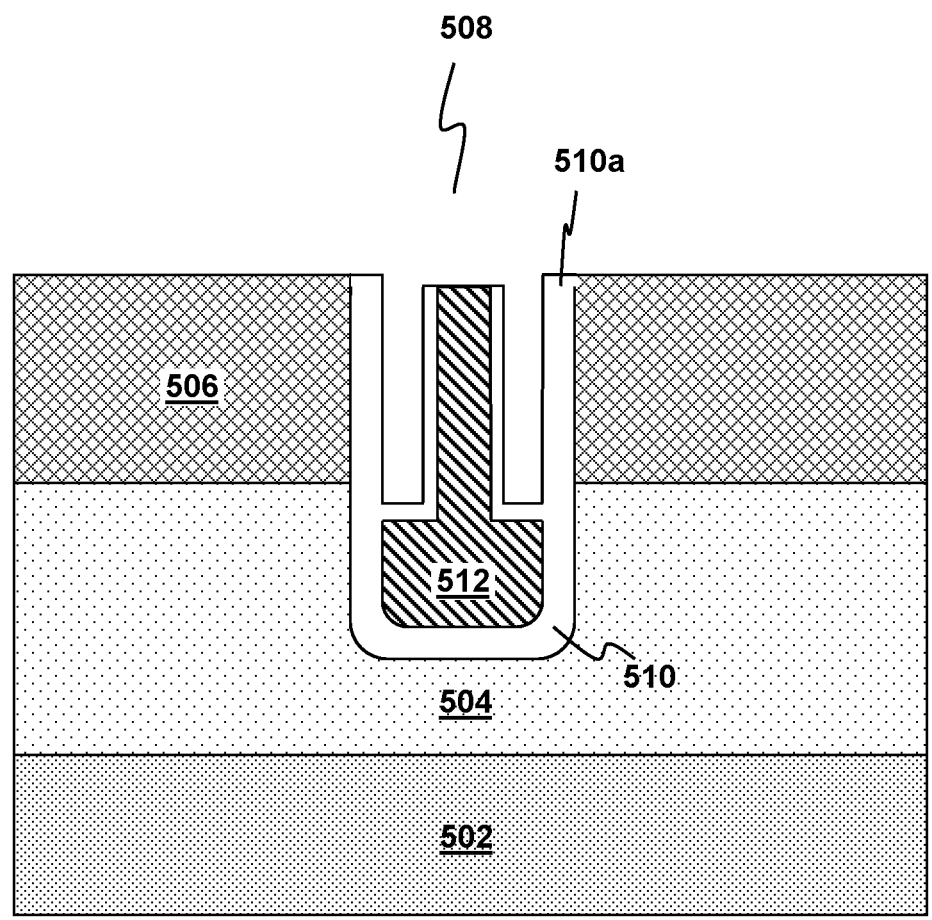
Figure 5G:
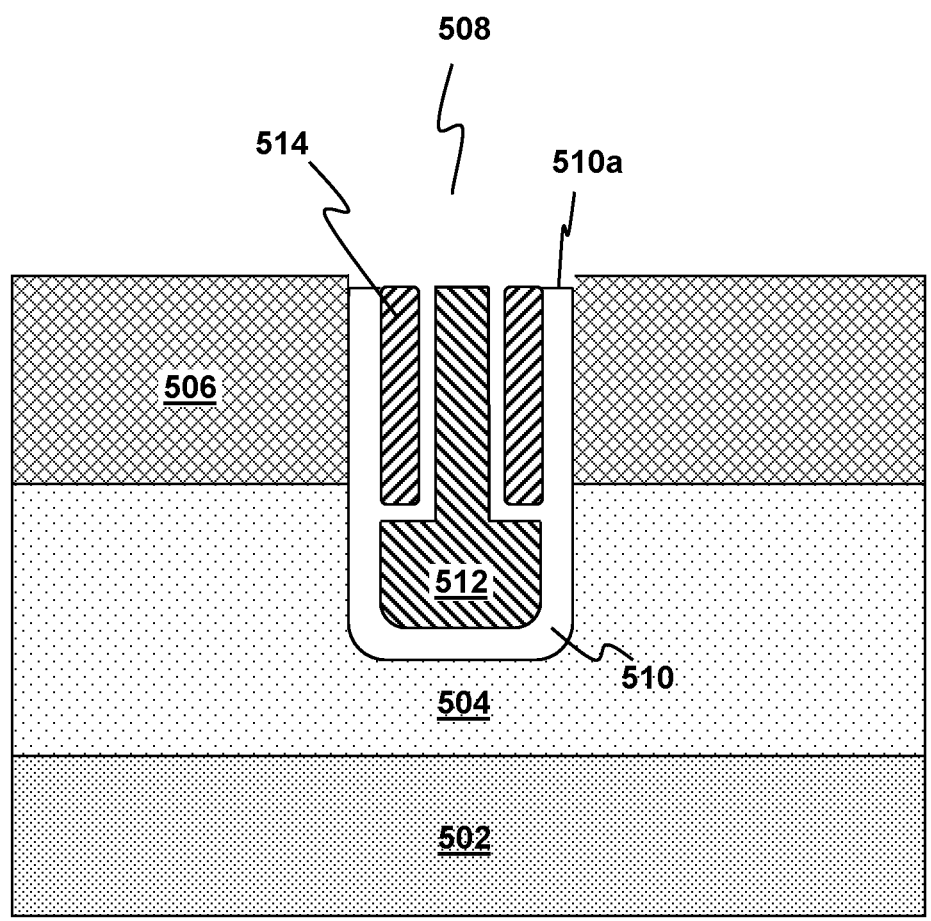

Next, the lining oxide above the bottom portion of the T-shape shield electrode is removed. Another dielectric layer 510a may be deposited or grown along the trench 508 and the shield electrode 512 as shown in FIG. 5F. The thickness of the dielectric layer 510a lining the trench 508 and the shield electrode 512 is about the same as the thickness between the shield electrode 512 and the sidewall of the trench 508. Deposition of a conductive material (e.g. polysilicon) is performed followed by an etch back to form the split gate electrode 514 as shown in FIG. 5G. The inter-poly oxide between the horizontal portion of the T-shaped shield electrode 512 and the split gate electrode 514 has a thickness about the same as the thickness of the liner oxide 510. By way of example, and not by way of limitation, the inter-poly oxide has a thickness in a range between 10 to 25 μm.

Figure 4F:
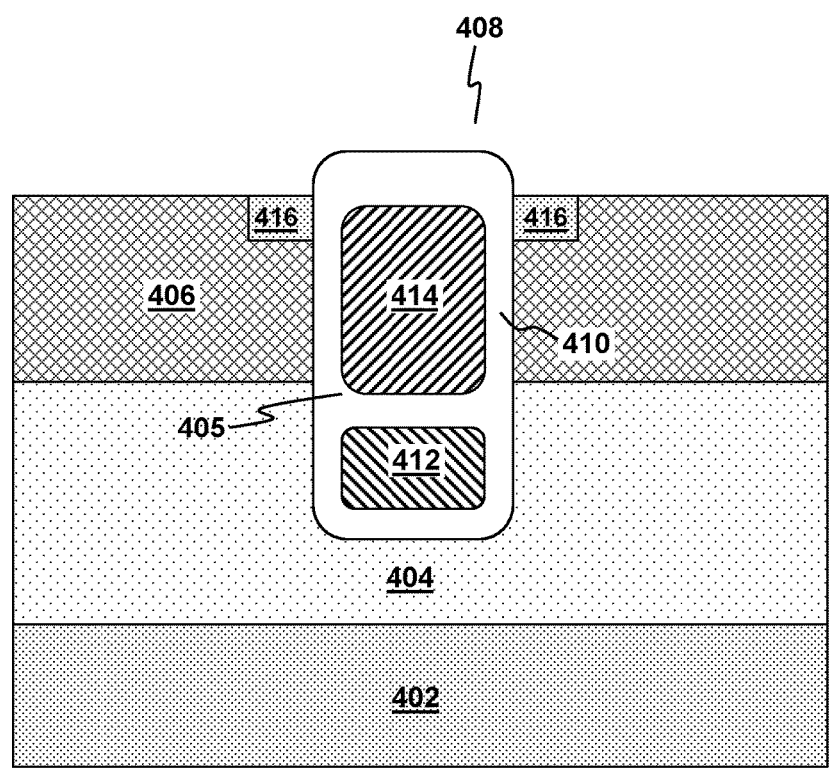

A masked implant (mask not shown) is then performed to form one or more source regions 416 of a first conductivity type as illustrated in FIG. 4F. By way of example, and not by way of limitation, the implant may be followed by diffusion to achieve the desired doping concentration. The source regions 416 are formed within a top surface of the body region 406 adjacent the sidewalls of the trench 408. By way of example, and not by way of limitation, the source regions 416 may be n+ source regions for an n+ type substrate 402.

Figure 4G:
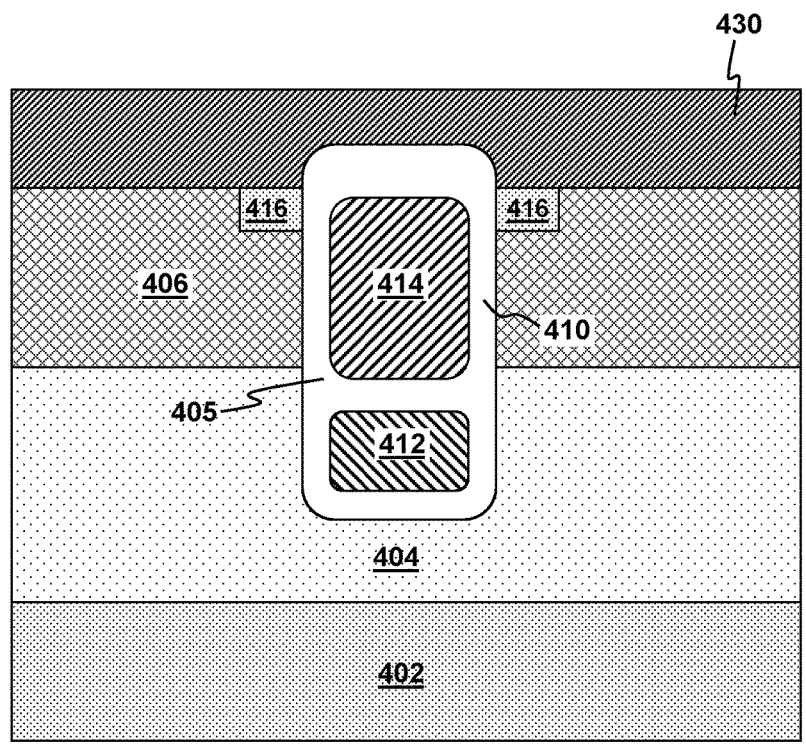

Metal pads may then be formed above the body layer 406 using a metal mask (not shown) to provide external contacts to the source regions 416, gate electrode 414, and shield electrode 412. As shown in FIG. 4G, a source pad 430 provides an external contact to the source regions 416 of the MOSFET device 400. The source pad 430 is insulated from the shield electrode 511 and gate electrode 513. A gate pad (not shown) provides an external contact to the gate electrode 414. A shield pad (not shown) provides an external contact to the shield electrode 412.

Figure 6:
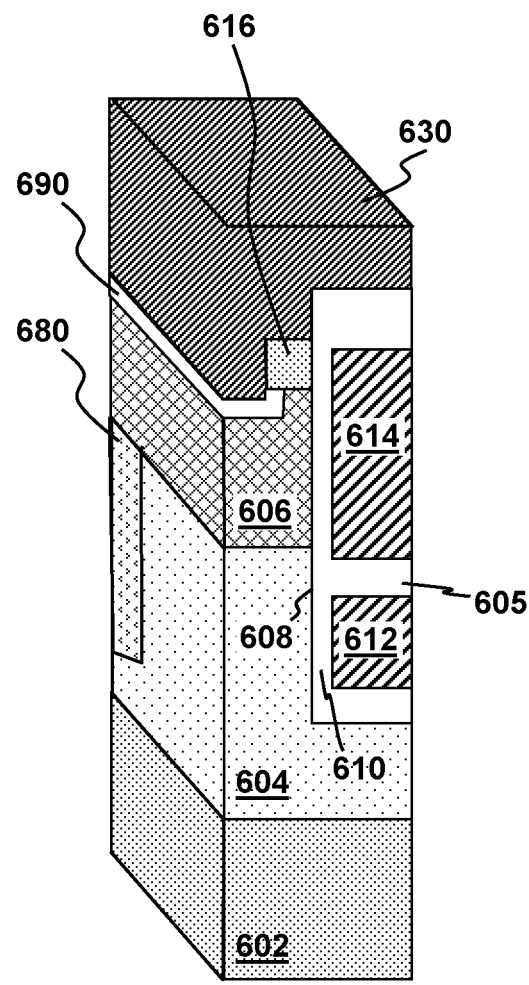
FIG. 6 is a three-dimensional cutaway view of a portion of a power semiconductor device with a super junction P-column according to aspects of the present disclosure.

For an embodiment where the MOSFET includes a P-column in core cell or $3^{rd}$ dimension to maintain charge balance, one extra process is required for forming the P-column. FIG. 6 is a three-dimensional view of a power semiconductor device 600 with a super junction P-column 680. The P-column 680 extends into a lightly-doped N-type epitaxial layer 604 that is formed on a more heavily doped N-type substrate 602. In this example a shield electrode 612 and gate electrode 614 are formed in a trench 608 in the epitaxial layer 604. The electrodes 612, 614 are insulated from the epitaxial layer 604 by a dielectric 610 that lines the walls of the trench 608 and are insulated from each other by an inter-electrode dielectric 605. The P-column 680 in FIG. 6 is formed in three dimensions and is connected to the body region 606 which forms an ohmic contact with the source pad 630 using a P+ layer 690. It is noted that the P column may be formed either in the core cell structure, or orthogonal to the core cell structure depending on design optimization and processing considerations. The P column 680 can be formed after the trench 608, body 606 and source regions 616 are formed. This would require a photo masking step to define regions in which the P column region will be formed followed by a series of low and high energy boron implants. Keeping the formation of the P column close to the end of the processing will minimize the thermal cycles after the P column formation thereby reducing its lateral diffusion. Comparing to the fabrication process for a conventional shielded gate trench MOSFET, the process for forming the MOSFET device according to aspects of the present disclosure is stable and much simpler because it does not have a deep trench, a thick liner oxide and nor does it require HDP filling and etch-back process.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶ 6.

What is claimed is:

1. A shielded gate trench field effect transistor, comprising:
   a) a substrate of a first conductivity type;
   b) an epitaxial layer of the first conductivity type provided on top of the substrate;
   c) a body region of a second conductivity type that is opposite to the first conductivity type formed above the epitaxial layer;
   d) a trench formed in the body region and epitaxial layer, wherein the trench is lined with a first dielectric layer and wherein the trench has a pitch less than 1 µm;
   e) a shield electrode formed in a lower portion of the trench, wherein the shield electrode is insulated from the epitaxial layer by the first dielectric layer;
   f) a gate electrode formed in an upper portion of the trench above the shield electrode, wherein the gate electrode is insulated from the epitaxial layer by the first dielectric layer and insulated from the shield electrode by a second dielectric layer, wherein the first and second dielectric layers have the same thickness; and
   g) one or more source regions of the first conductivity type formed in a top surface of the body region, wherein each source region is adjacent a sidewall of the trench.

2. The field effect transistor of claim 1, wherein the trench has a pitch about 0.6 um.

3. A shielded gate trench field effect transistor, comprising:
   a) a substrate of a first conductivity type;
   b) an epitaxial layer of the first conductivity type provided on top of the substrate;
   c) a body region of a second conductivity type that is opposite to the first conductivity type formed above the epitaxial layer;
   d) a trench formed in the body region and epitaxial layer, wherein the trench is lined with a first dielectric layer;
   e) a shield electrode formed in a lower portion of the trench, wherein the shield electrode is insulated from the epitaxial layer by the first dielectric layer;
   f) a gate electrode formed in an upper portion of the trench above the shield electrode, wherein the gate electrode is insulated from the epitaxial layer by the first dielectric layer and insulated from the shield electrode by a second dielectric layer, wherein the first and second dielectric layers have the same thickness ranging between 10 to 25 nm; and
   g) one or more source regions of the first conductivity type formed in a top surface of the body region, wherein each source region is adjacent a sidewall of the trench.

4. A shielded gate trench field effect transistor, comprising:
   a) a substrate of a first conductivity type;
   b) an epitaxial layer of the first conductivity type provided on top of the substrate;
   c) a body region of a second conductivity type that is opposite to the first conductivity type formed above the epitaxial layer;
   d) a trench formed in the body region and epitaxial layer, wherein the trench is lined with a first dielectric layer and wherein the trench is extended in depth about 0.5 microns or less;
   e) a shield electrode formed in a lower portion of the trench, wherein the shield electrode is insulated from the epitaxial layer by the first dielectric layer;
   f) a gate electrode formed in an upper portion of the trench above the shield electrode, wherein the gate electrode is insulated from the epitaxial layer by the first dielectric layer and insulated from the shield electrode by a second dielectric layer, wherein the first and second dielectric layers have the same thickness; and
   g) one or more source regions of the first conductivity type formed in a top surface of the body region, wherein each source region is adjacent a sidewall of the trench.

5. The field effect transistor of claim 1, wherein the epitaxial layer has a dopant concentration that is constant throughout its depth.

6. The field effect transistor of claim 1, wherein the shield electrode is as wide as the gate electrode.

7. A shielded gate trench field effect transistor, comprising:
   a) a substrate of a first conductivity type;
   b) an epitaxial layer of the first conductivity type provided on top of the substrate;
   c) a body region of a second conductivity type that is opposite to the first conductivity type formed above the epitaxial layer;
   d) a trench formed in the body region and epitaxial layer, wherein the trench is lined with a first dielectric layer;
   e) a shield electrode formed in a lower portion of the trench, wherein the shield electrode is insulated from the epitaxial layer by the first dielectric layer;
   f) a gate electrode formed in an upper portion of the trench above the shield electrode, wherein the gate electrode is insulated from the epitaxial layer by the first dielectric layer and insulated from the shield electrode by a second dielectric layer, wherein the first and second dielectric layers have the same thickness; and
   g) one or more source regions of the first conductivity type formed in a top surface of the body region, wherein each source region is adjacent a sidewall of the trench, wherein the shield electrode is an upside down T-shaped electrode with a horizontal portion and a vertical portion, and the gate electrode is split into two portions, each provided above the horizontal portion of the shield electrode.

8. The field effect transistor of claim 1, further comprising a P column formed in a core cell connected to the body region at the surface or orthogonal to the core cell.

9. The field effect transistor of claim 1, further comprising a source pad formed above the body region, wherein the source pad is electrically connected to the one or more source regions and insulated from the gate electrode and the shield electrode, the source pad providing an external contact to the one or more source region.

10. A shielded gate trench field effect transistor, comprising:
    a) a substrate of a first conductivity type, wherein a drain pad is provided under the substrate;
    b) an epitaxial layer of the first conductivity type provided on top of the substrate;
    c) a body region of a second conductivity type that is opposite to the first conductivity type formed above the epitaxial layer;
    d) a trench formed in the body region and epitaxial layer, wherein the trench is lined with a first dielectric layer;
    e) a shield electrode formed in a lower portion of the trench, wherein the shield electrode is insulated from the epitaxial layer by the first dielectric layer;
    f) a gate electrode formed in an upper portion of the trench above the shield electrode, wherein the gate electrode is insulated from the epitaxial layer by the first dielectric layer and insulated from the shield electrode by a second dielectric layer, wherein the first and second dielectric layers have the same thickness; and g) one or more source regions of the first conductivity type formed in a top surface of the body region, wherein each source region is adjacent a sidewall of the trench.

11. A method for manufacturing a shielded gate trench field effect transistor, comprising:
 a) providing an epitaxial layer of a first conductivity type on top of a substrate of the first conductivity type;
 b) providing a body region of a second conductivity type above the epitaxial layer, wherein the second conductivity type is opposite to the first conductivity type;
 c) providing a trench in the body region and epitaxial layer, wherein the trench is lined with a first dielectric layer and the trench has a pitch less than 1 µm;
 d) providing a shield electrode in a lower portion of the trench, wherein the shield electrode is insulated from the epitaxial layer by the first dielectric layer;
 e) providing a gate electrode in an upper portion of the trench above the shield electrode, wherein the gate electrode is insulated from the epitaxial layer by the first dielectric layer and insulated from the shield electrode by a second dielectric layer, wherein the first and second dielectric layers have the same thickness; and
 f) providing one or more source regions of the first conductivity type in a top surface of the body region, wherein each source region is adjacent a sidewall of the trench.

12. The method of claim 11, wherein the trench has a pitch about 0.6 um.

13. The method of claim 11, wherein the thickness of the first and second dielectric layer is in a range between 10 to 25 nm.

14. The method of claim 11, wherein the trench is extended in depth about 0.5 microns or less.

15. The method of claim 11, wherein the epitaxial layer has a dopant concentration that is constant throughout its depth.

16. The method of claim 11, wherein the shield electrode is as wide as the gate electrode.

17. The method of claim 11, wherein the shield electrode is an upside down T-shaped electrode with a horizontal portion and a vertical portion, and the gate electrode is split into two portions, each provided above the horizontal portion of the shield electrode.

18. The method of claim 11, further comprising forming a P column formed in a core cell connected to the body region at the surface or orthogonal to the core cell.

* * * * *